US012665419B2

(12) United States Patent
Yin et al.

(10) Patent No.: US 12,665,419 B2
(45) Date of Patent: Jun. 23, 2026

(54) BATTERY CURRENT SHARING CONTROL METHOD AND BATTERY CURRENT SHARING CONTROL SYSTEM

(71) Applicant: BYD COMPANY LIMITED, Shenzhen (CN)

(72) Inventors: Shaowen Yin, Shenzhen (CN); Xueqin Yin, Shenzhen (CN); Jianfei Jing, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 698 days.

(21) Appl. No.: 18/090,390

(22) Filed: Dec. 28, 2022

(65) Prior Publication Data

US 2023/0155377 A1 May 18, 2023

Related U.S. Application Data

(63) Continuation of application No. PCT/CN2021/103511, filed on Jun. 30, 2021.

(30) Foreign Application Priority Data

Jun. 30, 2020 (CN) ........................ 202010615141.X

(51) Int. Cl.
*H02J 1/10* (2026.01)
*G01R 31/3835* (2019.01)
*H02J 7/63* (2026.01)

(52) U.S. Cl.
CPC .......... *H02J 1/106* (2020.01); *G01R 31/3835* (2019.01); *H02J 7/63* (2026.01)

(58) Field of Classification Search
CPC ........ H02J 1/106; H02J 7/00306; H02J 1/102; H02J 7/0013; H02J 7/00714; H02J 7/34; H02J 7/0014; H02J 7/0063; G01R 31/3835

(Continued)

(56) References Cited

U.S. PATENT DOCUMENTS 4,502,000 A * 2/1985 Mashikian ............ H02J 7/0029
363/90
5,745,405 A * 4/1998 Chen ...................... G11C 29/50
365/201

(Continued)

FOREIGN PATENT DOCUMENTS

CN 201937303 U * 8/2011 ............. Y02E 60/10
CN 102185354 A * 9/2011 ................ H02J 7/00

(Continued)

OTHER PUBLICATIONS

CN 204156585 U(Machine Translation) (Year: 2015).*

(Continued)

*Primary Examiner* — M Baye Diao
(74) *Attorney, Agent, or Firm* — Sheppard Mullin Richter & Hampton LLP

(57) ABSTRACT

The present disclosure relates to a battery current sharing control method and a battery current sharing control system. The method includes: acquiring an actually measured cell array current corresponding to each of cell arrays; determining a target current of all cell arrays based on actually measured cell array currents corresponding to all the cell arrays; and adjusting an output current of each of cell array branches to the target current via adjusting current sharing DCDC converters based on the actually measured cell array currents corresponding to all the cell arrays and the target current. In this way, a capacity loss of the cell arrays caused by connecting in parallel can be reduced, and battery capacity utilization of the cell arrays can be improved.

20 Claims, 4 Drawing Sheets

(58) Field of Classification Search

USPC ........................................................ 320/149

See application file for complete search history.

(56) References Cited

U.S. PATENT DOCUMENTS

| | | | | |
|---|---|---|---|---|
| 6,642,631 | B1 * | 11/2003 | Clavette | H02J 1/102 |
| | | | | 323/282 |
| 7,298,197 | B2 * | 11/2007 | Duerbaum | H02J 1/102 |
| | | | | 307/82 |
| 8,362,643 | B2 * | 1/2013 | Luo | H02J 3/32 |
| | | | | 307/46 |
| 8,805,629 | B2 * | 8/2014 | Yin | H02S 40/34 |
| | | | | 323/299 |
| 9,444,275 | B2 * | 9/2016 | Huang | H02J 7/34 |
| 2012/0068540 | A1 * | 3/2012 | Luo | H02J 3/32 |
| | | | | 307/44 |

FOREIGN PATENT DOCUMENTS

| | | | | | |
|---|---|---|---|---|---|
| CN | 103607002 | A | | 2/2014 | |
| CN | 204156585 | U | * | 2/2015 | H02J 7/34 |
| CN | 204230982 | U | | 3/2015 | |
| CN | 106100032 | A | | 11/2016 | |
| CN | 107394243 | A | | 11/2017 | |
| CN | 109301812 | A | | 2/2019 | |
| CN | 110502057 | A | * | 11/2019 | G05F 1/625 |
| DE | 102012201605 | A1 | | 8/2013 | |
| DE | 102017002113 | A1 | | 9/2018 | |
| JP | 2004147477 | A | | 5/2004 | |
| JP | 2020-022304 | A | | 2/2020 | |

OTHER PUBLICATIONS

Wang et al., (Wang) CN 201937303U(Machine Translation) (Year: 2011).*

K. D. Hoang and H.-H. Lee, "Accurate Power Sharing With Balanced Battery State of Charge in Distributed DC Microgrid," in IEEE Transactions on Industrial Electronics, vol. 66, No. 3, pp. 1883-1893, Mar. 2019 (Year: 2019).*

H. Du, C. Jiang, G. Wen, W. Zhu and Y. Cheng, "Current Sharing Control for Parallel DCâDC Buck Converters Based on Finite-Time Control Technique," in IEEE Transactions on Industrial Informatics, vol. 15, No. 4, pp. 2186-2198, Apr. 2019 (Year: 2019).*

W. Huang and J. A. Abu Qahouq, "Energy Sharing Control Scheme for State-of-Charge Balancing of Distributed Battery Energy Storage System," in IEEE Transactions on Industrial Electronics, vol. 62, No. 5, pp. 2764-2776, May 2015 (Year: 2015).*

M. Kamel, R. Zane and D. Maksimovic, "Voltage Sharing of Series Connected Battery Modules in a Plug-and-Play DC Microgrid," 2019 20th Workshop on Control and Modeling for Power Electronics (COMPEL), Toronto, ON, Canada, 2019, pp. 1-7 (Year: 2019).*

International Search Report and Written Opinion for Application No. PCT/CN2021/103511, mailed on Sep. 23, 2021, 8 pages.

* cited by examiner

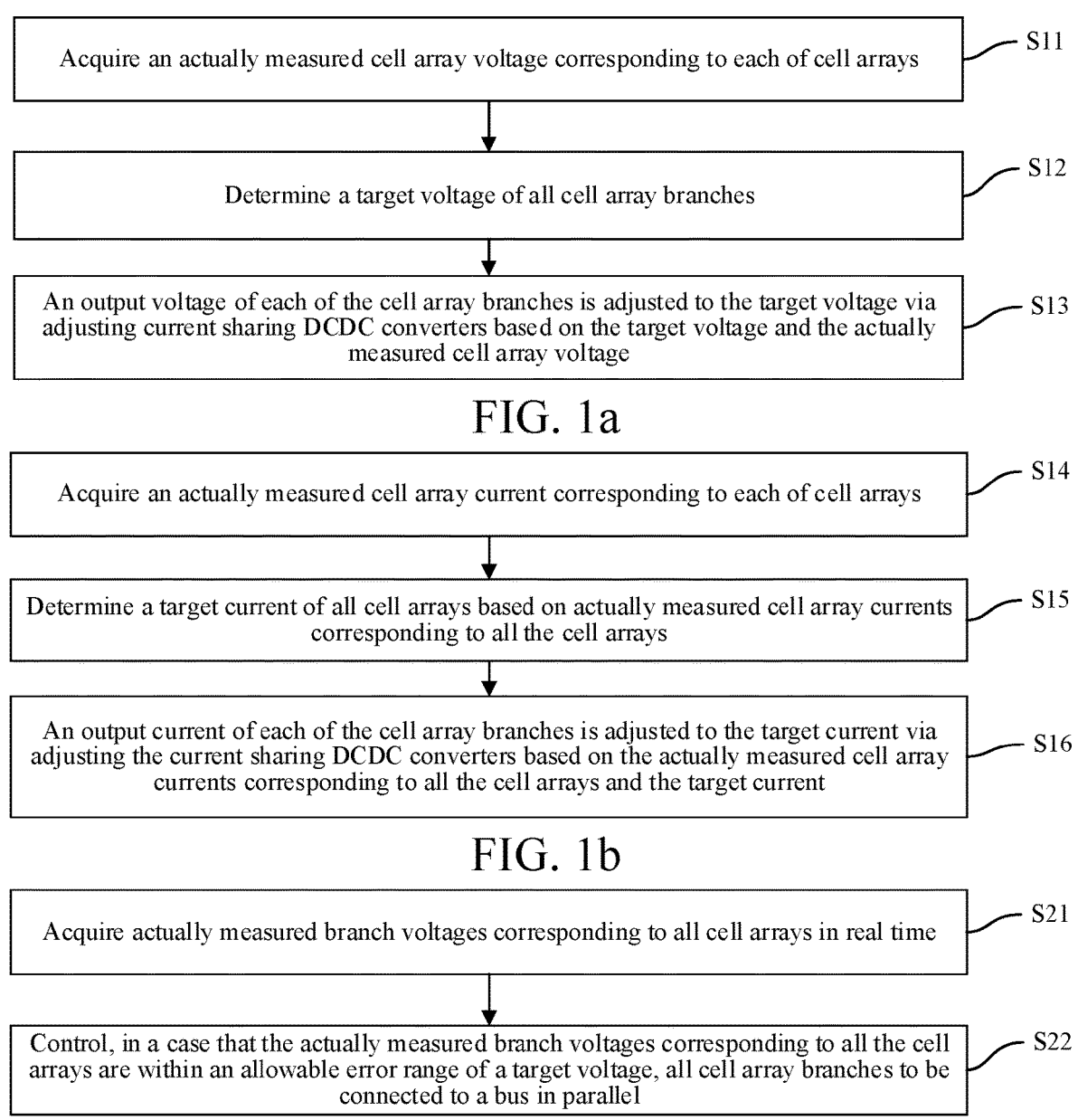

| Acquire an actually measured cell array voltage corresponding to each of cell arrays | — S11 |

↓

| Determine a target voltage of all cell array branches | — S12 |

↓

| An output voltage of each of the cell array branches is adjusted to the target voltage via adjusting current sharing DCDC converters based on the target voltage and the actually measured cell array voltage | — S13 |

FIG. 1a

| Acquire an actually measured cell array current corresponding to each of cell arrays | — S14 |

↓

| Determine a target current of all cell arrays based on actually measured cell array currents corresponding to all the cell arrays | — S15 |

↓

| An output current of each of the cell array branches is adjusted to the target current via adjusting the current sharing DCDC converters based on the actually measured cell array currents corresponding to all the cell arrays and the target current | — S16 |

FIG. 1b

| Acquire actually measured branch voltages corresponding to all cell arrays in real time | — S21 |

↓

| Control, in a case that the actually measured branch voltages corresponding to all the cell arrays are within an allowable error range of a target voltage, all cell array branches to be connected to a bus in parallel | — S22 |

FIG. 2

| Acquire current cell array capacities corresponding to all cell array branches in real time, and determine whether the current cell array capacities are between a lower-limit cell array capacity and an upper-limit cell array capacity | — S31 |

| Disconnect, in a case that a current cell array capacity corresponding to any one of the cell array branches is not between the lower-limit cell array capacity and the upper-limit cell array capacity, the cell array branch from the bus, and repeatedly perform the step of acquiring the actually measured cell array voltage corresponding to each of the cell arrays | — S32 |

FIG. 3

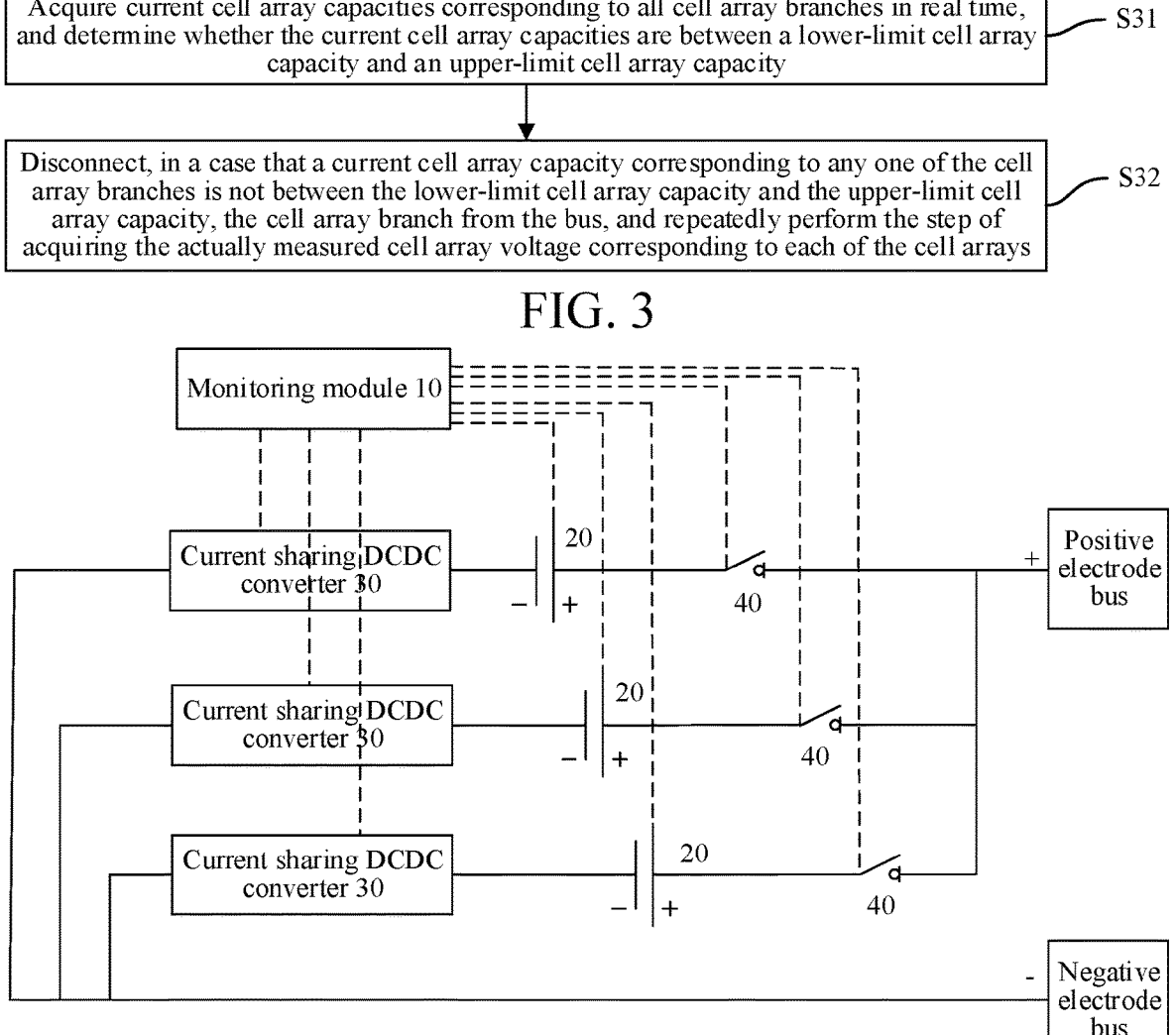

FIG. 4

BATTERY CURRENT SHARING CONTROL METHOD AND BATTERY CURRENT SHARING CONTROL SYSTEM

CROSS-REFERENCE TO RELATED APPLICATIONS

The application is a continuation application of International Patent Application No. PCT/CN2021/103511 filed with the China National Intellectual Property Administration (CNIPA) on Jun. 30, 2021, which is based on and claims priority to and benefits of Chinese Patent Application No. 202010615141.X, entitled "BATTERY CURRENT SHARING CONTROL METHOD AND BATTERY CURRENT SHARING CONTROL SYSTEM" and filed on Jun. 30, 2020. The entire content of the above-referenced applications is incorporated herein by reference.

FIELD

The present disclosure relates to the technical field of battery production, and in particular, to a battery current sharing control method and a battery current sharing control system.

BACKGROUND

When cell arrays are currently connected to a bus in parallel, the cell arrays may have different capacities, internal resistances, voltages, and self-discharge rates due to manufacture inconsistency and a usage environment of the cell arrays. As a result, in a process of charging/discharging the cell array, a part of cell arrays may be overcharged or discharged, that is, the cell arrays connected in parallel are not current sharing. The part of cell arrays are in an overcharged or over-discharged state for a long time due to the influence of factors such as the increase of a quantity of charging/discharging cycles of the cell arrays, the storage time, the temperature, and the like. Consequently, on one hand, the inconsistency of the cell arrays may be exacerbated; and on the other hand, the battery may be gradually deteriorated, finally causing all cell arrays to lose the capability of storing electrical energy.

SUMMARY

The present disclosure provides a battery current sharing control method and a battery current sharing control system, to resolve problems such as a large capacity loss and battery deterioration caused by not current-sharing of a part of cell arrays in at least two cell arrays connected in parallel.

The present disclosure provides a battery current sharing control method applied to a battery current sharing control system. The battery current sharing control system includes multiple cell array branches connected in parallel, and each of the cell array branches includes a cell array and a current sharing DCDC converter serially connected to the cell array. The method includes:

acquiring an actually measured cell array current corresponding to each of the cell arrays;

determining a target current of all cell arrays based on actually measured cell array currents corresponding to all the cell arrays; and adjusting an output current of each of the cell array branches to the target current via adjusting the current sharing DCDC converters based on the actually measured cell array currents corresponding to all the cell arrays and the target current.

Optionally, before the acquiring the actually measured cell array current corresponding to each of the cell arrays, the battery current sharing control method further includes:

acquiring an actually measured cell array voltage corresponding to each of the cell arrays;

determining a target voltage of all cell array branches; and adjusting an output voltage of each of the cell array branches to the target voltage via adjusting the current sharing DCDC converters based on the target voltage and the actually measured cell array voltage.

Optionally, the determining the target voltage of all the cell array branches includes:

determining a maximum voltage value in actually measured cell array voltages corresponding to all the cell arrays as the target voltage of all the cell array branches based on the actually measured cell array voltages corresponding to all the cell arrays; or determining a minimum voltage value in actually measured cell array voltages corresponding to all the cell arrays as the target voltage of all the cell array branches based on the actually measured cell array voltages corresponding to all the cell arrays; or determining an average voltage value of actually measured cell array voltages corresponding to all the cell arrays as the target voltage of all the cell array branches based on the actually measured cell array voltages corresponding to all the cell arrays; or determining a voltage of a bus connected to the multiple cell array branches as the target voltage of all the cell array branches.

Optionally, the adjusting an output voltage of each of the cell array branches to the target voltage via adjusting the current sharing DCDC converters based on the target voltage and the actually measured cell array voltage includes:

obtaining a voltage sharing voltage correction value corresponding to a current sharing DCDC converter connected to each of the cell arrays in series by using a formula, where the formula is $U_{obj}i = U_{dcStd} - U_{bat}i$, $U_{obj}i$ is a voltage sharing voltage correction value, $U_{dcStd}$ is a target voltage, and $U_{bat}i$ is an actually measured cell array voltage of an $i^{th}$ cell array; and adjusting the output voltage of each of the cell array branches to the target voltage via adjusting a duty cycle of each of the current sharing DCDC converters based on a voltage sharing voltage correction value corresponding to the current sharing DCDC converter.

Optionally, before the acquiring the actually measured cell array current corresponding to each of the cell arrays, the battery current sharing control method further includes:

acquiring actually measured branch voltages corresponding to all cell arrays in real time; and controlling, in a case that the actually measured branch voltages corresponding to all the cell arrays are within an allowable error range of the target voltage, all the cell array branches to be connected to a bus in parallel.

Optionally, after the controlling all the cell array branches to be connected to the bus in parallel, the battery current sharing control method further includes:

acquiring current cell array capacities corresponding to all the cell array branches in real time, and determining whether the current cell array capacities are between a lower-limit cell array capacity and an upper-limit cell array capacity; and disconnecting, in a case that a current cell array capacity corresponding to any one of the cell array branches is not between the lower-limit cell array capacity and the upper-limit cell array capacity, the cell array branch from the bus, and repeatedly performing the step of acquiring the actually measured cell array voltage corresponding to each of the cell arrays.

Optionally, the determining the target current of all the cell arrays based on the actually measured cell array currents corresponding to all the cell arrays includes:

determining an average current of the actually measured cell array currents corresponding to all the cell arrays as the target current of all the cell arrays based on the actually measured cell array currents corresponding to all the cell arrays; or calculating a charge/discharge rate coefficient based on current cell array capacities corresponding to all the cell arrays and a current charge/discharge limit value; and determining the target current of all the cell arrays based on the actually measured cell array currents corresponding to all the cell arrays and the charge/discharge rate coefficient.

Optionally, the adjusting an output current of each of the cell array branches to the target current via adjusting the current sharing DCDC converters based on the actually measured cell array currents corresponding to all the cell arrays and the target current includes:

obtaining a current sharing voltage correction value corresponding to a current sharing DCDC converter connected to each of the cell arrays in series by using a formula, where the formula is $\text{DaltaU}_{obj}i=(I_{bat}i-I_{obj}i)*(K_p+K_i/s)$, $\text{DaltaU}_{obj}i$ is a current sharing voltage correction value of an $i^{th}$ cell array, $I_{bat}i$ bar is an actually measured cell array current of the $i^{th}$ cell array, $I_{obj}i$ is a target current of the $i^{th}$ cell array, $K_p$ is a preset rate coefficient, $K_i$ is a preset integral coefficient, and s is a frequency domain; and adjusting the output current of each of the cell array branches to the target current via adjusting a duty cycle of each of the current sharing DCDC converters based on a current sharing voltage correction value corresponding to the current sharing DCDC converter.

The present disclosure provides a battery current sharing control system, including a monitoring module and multiple cell array branches arranged on a bus in parallel, where each of the cell array branches includes a cell array and a current sharing DCDC converter connected to the cell array, and the monitoring module is connected to the cell arrays and the current sharing DCDC converters and is configured to acquire cell array state information of the cell array branches, and adjust a duty cycle of each of the current sharing DCDC converters based on the cell array state information, to achieve current sharing control.

Optionally, the battery current sharing control system further includes a current sharing power supply; the current sharing DCDC converter is a non-isolated DCDC converter connected to the current sharing power supply; an input terminal of the non-isolated DCDC converter is connected to the current sharing power supply; and an output terminal of the current sharing DCDC converter is connected to the cell array and the bus.

Optionally, the current sharing DCDC converter is an isolated DCDC converter; an input terminal of the isolated DCDC converter is connected to the cell array; and an output terminal of the isolated DCDC converter is connected to the cell array and the bus.

In the foregoing battery current sharing control method, before cell arrays are connected in parallel, an output voltage of each of cell array branches is adjusted to the target voltage via adjusting a duty cycle of each of current sharing DCDC converters based on an actually measured cell array voltage corresponding to each of the cell arrays and a target voltage corresponding to all cell arrays, thereby achieving non-inrush current paralleling. After the cell arrays are connected in parallel, an output current of each of the cell array branches is adjusted to the target current via adjusting the duty cycle of each of the current sharing DCDC converters based on actually measured cell array currents and corresponding to all the cell arrays and a target current. In this way, current sharing control is achieved, a capacity loss of the cell arrays caused by connecting in parallel is reduced, battery capacity utilization of the cell arrays is improved, and an energy loss caused by internal circulation after charge/discharge may be reduced, thereby ensuring a service life of the cell arrays connected in parallel, and ensuring safety in a process of charging/discharging the cell arrays.

In the foregoing battery current sharing control system, each cell array and each current sharing DCDC converter are connected in series to form a cell array branch. Cell array state information of the cell array branch is acquired by a monitoring module, and the cell array state information is processed to further control the current sharing DCDC converter to adjust a duty cycle thereof, to adjust an output current of the cell array, thereby achieving current sharing of cell array branches connected in parallel. In this way, the capacity loss of the cell arrays caused by connecting in parallel is reduced, the battery capacity utilization of the cell arrays is improved, and the energy loss caused by internal circulation after charge/discharge may be reduced, thereby ensuring the service life of the cell arrays connected in parallel, and ensuring the safety in the process of charging/discharging the cell arrays.

BRIEF DESCRIPTION OF THE DRAWINGS

To describe the technical solutions in the embodiments of the present disclosure more clearly, the following briefly describes the accompanying drawings required for describing the embodiments of the present disclosure. Apparently, the accompanying drawings in the following description show merely some embodiments of the present disclosure, and a person of ordinary skill in the art may still derive other drawings from such accompanying drawings without creative efforts.

FIG. 1a and FIG. 1b are schematic flowcharts of a battery current sharing control method according to an embodiment of the present disclosure;

FIG. 2 is another schematic flowchart of a battery current sharing control method according to an embodiment of the present disclosure;

FIG. 3 is another schematic flowchart of a battery current sharing control method according to an embodiment of the present disclosure;

FIG. 4 is a schematic circuit diagram of a battery current sharing control system according to an embodiment of the present disclosure;

DETAILED DESCRIPTION

Figure 5:
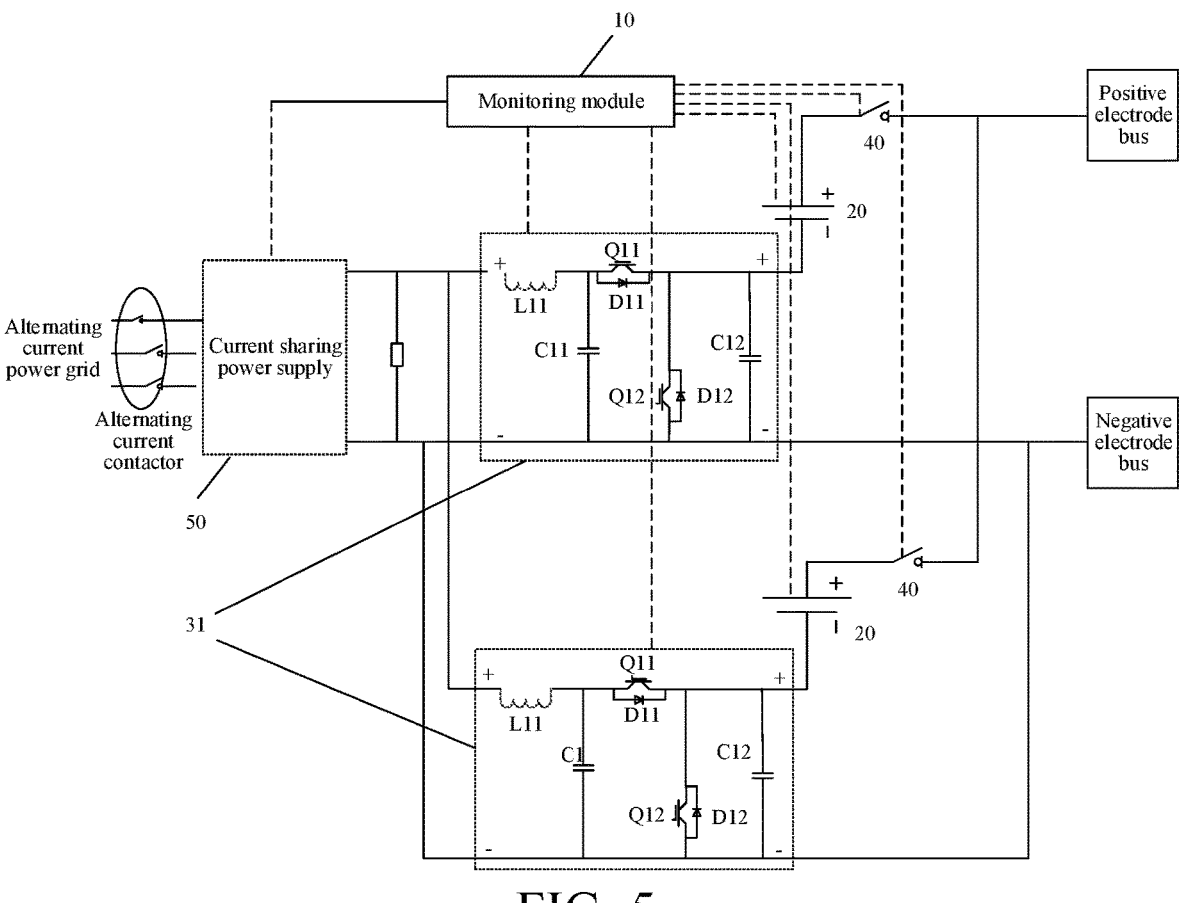
FIG. 5 is another schematic circuit diagram of a battery current sharing control system according to an embodiment of the present disclosure.

The following clearly and completely describes the technical solutions in the embodiments of the present disclosure with reference to the accompanying drawings in the embodiments of the present disclosure. Apparently, the described embodiments are some of the embodiments of the present disclosure rather than all of the embodiments. All other embodiments obtained by a person of ordinary skill in the art based on the embodiments of the present disclosure without creative efforts shall fall within the protection scope of the present disclosure.

It should be understood that the present disclosure can be implemented in different forms and should not be construed as being limited to the embodiments provided herein. Conversely, the embodiments are provided to make the present disclosure thorough and complete, and fully convey the scope of the present disclosure to a person skilled in the art. In the accompanying drawings, for clarity, the sizes and relative sizes of layers and regions may be exaggerated, and the same reference numerals denote the same elements throughout the present disclosure.

It should be understood that when an element or layer is referred to as being "on", "adjacent to", "connected to" or "coupled to" other elements or layers, it can be directly located on, adjacent, connected or coupled to the other elements or layers, or there may be an intervening element or layer. Conversely, when an element is referred to as being "directly on", "directly adjacent to", "directly connected to" or "directly coupled to" other elements or layers, no intervening element or layer is present. It should be understood that although the terms first, second, and third, etc. can be used to describe various elements, components, regions, layers and/or portions, these elements, components, regions, layers and/or portions should not be limited by such terms. The terms are only used for distinguishing one element, component, region, layer or portion from another element, component, region, layer, or portion. Therefore, without departing from the teachings of the present disclosure, the first element, component, region, layer or portion discussed below may be expressed as a second element, component, region, layer, or portion.

Terms indicating the spatial relationships such as "under", "below", "lower", "beneath", "above", and "upper" are used herein for the convenience of description, to describe the relationship between one element or feature and other elements or features shown in the figure. It may be understood that in addition to the orientations shown in the figures, the terms indicating the spatial relationships are also intended to include different orientations of a device in use and operation. For example, if the device in the figure is upside down, then an element or feature described as being "under", "beneath" or "below" other elements will be oriented to be "above" the other elements or features. Therefore, the exemplary terms "under" and "below" may include both an upper and a lower orientation. The device can be otherwise oriented (rotated by 90 degrees or in other orientations) and the spatial descriptions used here are interpreted accordingly.

The terms are used herein merely for purpose of describing specific embodiments and not as a limitation of the present disclosure. When used herein, the singular forms "a", "an" and "the" are also meant to include the plural form, unless otherwise clearly indicated. It should also be understood that the terms "consisting of" and/or "including", when used in this specification, confirm the existence of the described features, integers, steps, operations, elements and/or components, but do not exclude the existence or addition of one or more other features, integers, steps, operations, elements, components and/or groups. As used herein, the term "and/or" includes any and all combinations of related listed items.

For the purpose of thoroughly understanding the present disclosure, a detailed structure and steps may be provided below to explain the technical solutions proposed in the present disclosure. Exemplary embodiments of the present disclosure are described below in detail. However, in addition to the detailed descriptions, other implementations may also be provided in the present disclosure.

An embodiment of the present disclosure provides a battery current sharing control method. The battery current sharing control method is applied to a battery current sharing control system. The battery current sharing control system includes multiple cell array branches connected in parallel. Each of the cell array branches includes a cell array and a current sharing DCDC converter serially connected to the cell array. The current sharing DCDC converter is a bidirectional DCDC converter, that is, a DCDC converter that can achieve boost control and buck control. In this example, the battery current sharing control system further includes a monitoring module connected to the cell arrays and the current sharing DCDC converters. The monitoring module includes sampling circuits and controllers connected to the sampling circuits. The sampling circuits are connected to the cell arrays and the current sharing DCDC converters and are configured to acquire cell array state information of each of the cell array branches on which the cell array and the current sharing DCDC converter are arranged, and feedback the cell array state information to the controller. The cell array state information includes, but is not limited to, an actually measured cell array voltage, an actually measured cell array current, a current cell array capacity, an actually measured converter voltage, an actually measured converter current, a bus voltage, and the like. The controller is also connected to the current sharing DCDC converters and is configured to perform comprehensive calculation and determination processing on the cell array state information to form a PWM signal. A duty cycle of each of the current sharing DCDC converters may be adjusted by controlling the current sharing DCDC converter by using the PWM signal, and an output current of each of the cell arrays is adjusted, to achieve current sharing output.

In an embodiment, as shown in FIG. 1a and FIG. 1b, the battery current sharing control method includes the following steps:

S11: An actually measured cell array voltage corresponding to each of cell arrays is acquired.

The actually measured cell array voltage is a voltage acquired at two terminals of the cell array in real time.

In this example, before cell arrays are connected in parallel, that is, in a case that a controller controls switch contactors 40 in all cell array branches to be turned off, the actually measured cell array voltage corresponding to each of the cell arrays is acquired by a sampling circuit in real time, and the acquired actually measured cell array voltage corresponding to each of the cell arrays is fed back to the controller, so that the controller may obtain actually measured cell array voltages before all cell arrays are connected to a bus in parallel.

S12: A target voltage of all cell array branches is determined.

The target voltage is a to-be-adjusted voltage expected by cell array branches formed by the cell arrays and the current sharing DCDC converters connected to the cell arrays in series.

In an example, the determining the target voltage of all the cell array branches includes: determining a maximum voltage value in actually measured cell array voltages corresponding to all cell arrays as the target voltage of all the cell array branches based on the actually measured cell array voltages corresponding to all the cell arrays. For example, after obtaining actually measured cell array voltages of all cell arrays, the controller selects a maximum voltage value from the actually measured cell array voltages of all the cell arrays as the target voltage, that is, $U_{dcStd}=\max[U_{bat}i]$, where $U_{dcStd}$ is a target voltage, $U_{bat}i$ is an actually measured cell array voltage of an $i^{th}$ cell array, and n is a quantity of cell arrays. In this example, the maximum voltage value in the actually measured cell array voltages corresponding to all the cell arrays and a voltage value within an allowable error range may be determined as the target voltage of all the cell array branches.

In an example, the determining the target voltage of all the cell array branches includes: determining a minimum voltage value in actually measured cell array voltages corresponding to all the cell arrays as the target voltage of all the cell array branches based on the actually measured cell array voltages corresponding to all the cell arrays. For example, after obtaining actually measured cell array voltages of all cell arrays, the controller selects a minimum voltage value from the actually measured cell array voltages of all the cell arrays as the target voltage, that is, $U_{dcStd}=\min[U_{bat}i]$, where $U_{dcStd}$ is a target voltage, $U_{bat}i$ is an actually measured cell array voltage of an $i^{th}$ cell array, and n is a quantity of cell arrays. In this example, the minimum voltage value in the actually measured cell array voltages corresponding to all the cell arrays and a voltage value within an allowable error range may be determined as the target voltage of all the cell array branches.

In an example, the determining the target voltage of all the cell array branches includes: determining an average voltage value of actually measured cell array voltages corresponding to all the cell arrays as the target voltage of all the cell array branches based on the actually measured cell array voltages corresponding to all the cell arrays. For example, after obtaining actually measured cell array voltages of all cell arrays, the controller selects an average voltage value from the actually measured cell array voltages of all the cell arrays as the target voltage, that is, $U_{dcStd}=\mathrm{avg}[U_{bat}i]$, where $U_{dcStd}$ is a target voltage, $U_{bat}i$ is an actually measured cell array voltage of an $i^{th}$ cell array, and n is a quantity of cell arrays. In this example, the average voltage value in the actually measured cell array voltages corresponding to all the cell arrays and a voltage value within an allowable error range may be determined as the target voltage of all the cell array branches.

In an example, the determining the target voltage of all the cell array branches includes: determining a voltage of a bus connected to multiple cell array branches as the target voltage of all the cell array branches. In this example, the voltage of the bus connected to the multiple cell array branches and a voltage value within an allowable error range may be determined as the target voltage of all the cell array branches.

S13: An output voltage of each of the cell array branches is adjusted to the target voltage via adjusting the current sharing DCDC converters based on the target voltage and the actually measured cell array voltage.

In this example, the controller may form, according to the target voltage and the actually measured cell array voltage of each of the cell arrays, a PWM signal of the current sharing DCDC converters for controlling to connect to the cell arrays in series, and transmit the PWM signal to the current sharing DCDC converters to adjust the output voltage of each of the cell array branches to the target voltage via adjusting a duty cycle of each of the current sharing DCDC converters, and before the cell array branches are connected to the bus in parallel, the output voltage of each of the cell array branches formed by the cell array and the current sharing DCDC converters connected to the cell arrays in series follows the target voltage to achieve voltage sharing control before the cell array branches are connected in parallel, thereby ensuring non-inrush current paralleling during subsequent parallel connection of the cell arrays.

In an embodiment, in step S13, the adjusting an output voltage of each of the cell array branches to the target voltage via adjusting the current sharing DCDC converters based on the target voltage and the actually measured cell array voltage specifically includes the following steps:

S131: A voltage sharing voltage correction value corresponding to a current sharing DCDC converter connected to each of the cell arrays in series is obtained by using a formula. The formula is $U_{obj}i=U_{dcStd}-U_{bat}i$, $U_{obj}i$ is a voltage sharing voltage correction value, $U_{dcStd}$ is a target voltage, and $U_{bat}i$ is an actually measured cell array voltage of an $i^{th}$ cell array.

The voltage sharing voltage correction value is a to-be-adjusted voltage expected by each current sharing DCDC converters before the cell array branch is controlled to be connected to the bus in parallel, so that the output voltage of each of the cell array branch formed by each current sharing DCDC converter and a cell array connected to the current sharing DCDC converter in series may follow the target voltage, to achieve voltage sharing control.

In this example, before the cell array branches are connected to the bus in parallel, the controller obtains a voltage sharing voltage correction value corresponding to a current sharing DCDC converter connected to each of the cell arrays via performing calculation on an acquired target voltage and an actually measured cell array voltage at two ends of the cell arrays by using a preset formula for calculating a voltage sharing voltage correction value. The voltage sharing voltage correction value may be a desired voltage for controlling the current sharing DCDC converters before the cell array branches are connected to the bus in parallel.

It may be understood that, in step S12, the target voltage of all the cell array branches may be determined in multiple manners, and the target voltage determined in different manners may have different values. Since the voltage sharing voltage correction value subsequently determined based on the target voltage and the actually measured cell array voltage adjusts the duty cycle of the current sharing DCDC converter, calculation is performed on the target voltage and the actually measured cell array voltage corresponding to each of the cell arrays by using a formula for calculating a voltage sharing voltage correction value corresponding to a manner for obtaining the target voltage, to ensure that an obtained voltage sharing voltage correction value is more proper, thereby ensuring convenience of subsequently adjusting the duty cycle of the current sharing DCDC converter.

In an example, in step S12, in a case that a maximum voltage value in n actually measured cell array voltages $U_{bat}i$ is determined as a target voltage $U_{dcStd}$ (that is, $U_{dcStd}=\max[U_{bat}i]$), a formula corresponding to the target voltage for calculating a voltage sharing voltage correction value is $U_{obj}i=U_{dcStd}-U_{bat}i$, and a voltage sharing voltage correction value $U_{obj}i$ corresponding to a current sharing DCDC converter connected to an $i^{th}$ cell array in series may be obtained by using the foregoing formula. The target voltage $U_{dcStd}$ is a maximum voltage value, the voltage sharing voltage correction value is $U_{obj}i\geq 0$ in this case, and therefore, an output voltage of a corresponding cell array branch subsequently needs to be boosted to the target voltage by using the current sharing DCDC converter.

In an example, in step S12, in a case that a minimum voltage value in n actually measured cell array voltages $U_{bat}i$ is determined as a target voltage $U_{dcStd}$ (that is, $U_{dcStd}$=min $[U_{bat}i]$), a formula corresponding to the target voltage for calculating a voltage sharing voltage correction value is $U_{obj}i=U_{dcStd}-U_{bat}i$, and a voltage sharing voltage correction value $U_{obj}i$ corresponding to a current sharing DCDC converter connected to an $i^{th}$ cell array in series may be obtained by using the foregoing formula. The target voltage $U_{dcStd}$ is a minimum voltage value. In this case, the voltage sharing voltage correction value is $U_{obj}i \leq 0$, and an output voltage of a corresponding cell array branch needs to be bucked to the target voltage by using the current sharing DCDC converter.

In an example, in step S12, in a case that an average voltage value of n actually measured cell array voltages $U_{bat}i$ is determined as a target voltage $U_{dcStd}$ (that is, $U_{dcStd}$=avg$[U_{bat}i]$), a formula corresponding to the target voltage for calculating a voltage sharing voltage correction value is $U_{obj}i=U_{bat}i-U_{dcStd}$, and a voltage sharing voltage correction value $U_{obj}i$ corresponding to a current sharing DCDC converter connected to an $i^{th}$ cell array in series may be obtained by using the foregoing formula. In other words, a voltage sharing voltage correction value of each cell array branch may be separately determined according to a difference between the actually measured cell array voltage $U_{bat}i$ and the target voltage $U_{dcStd}$, and then the output voltage of the corresponding cell array branch is boosted or bucked to the target voltage by using the current sharing DCDC converter. It may be understood that, bucking or boosting herein depends on whether the voltage sharing voltage correction value $U_{obj}i$ is positive or negative.

In an example, in step S12, the voltage of the bus connected to the multiple cell array branches may be determined as the target voltage of all the cell array branches, a formula corresponding to the target voltage for calculating a voltage sharing voltage correction value is $U_{obj}i=U_{bat}i-U_{dcStd}$, and a voltage sharing voltage correction value $U_{obj}i$ corresponding to a current sharing DCDC converter connected to an $i^{th}$ cell array in series may be obtained by using the foregoing formula. In other words, a voltage sharing voltage correction value of each cell array branch may be separately determined according to a difference between the actually measured cell array voltage $U_{bat}i$ and the target voltage $U_{dcStd}$, and then the output voltage of the corresponding cell array branch is boosted or bucked to the target voltage by using the current sharing DCDC converter. It may be understood that, bucking or boosting herein depends on whether the voltage sharing voltage correction value $U_{obj}i$ is positive or negative.

The following embodiments are described by using an example in which a maximum voltage value in n actually measured cell array voltages $U_{bat}i$ is determined as the target voltage, and other embodiments are similar to the foregoing embodiments. This is not further illustrated in the present disclosure.

For example, in an example shown in FIG. 5, a current sharing power supply is first controlled to be powered on, where a constant DC output voltage is $U_{dcHigh}$; an actually measured cell array voltage $U_{bat}i$ corresponding to an $i^{th}$ cell array is acquired, where $1 \leq i \leq n$, and n is a quantity of cell arrays; a maximum voltage value in n actually measured cell array voltages $U_{bat}i$ may be determined as a target voltage $U_{dcStd}$, that is, $U_{dcStd}$=max$[U_{bat}i]$; then, a voltage sharing voltage correction value $U_{obj}i$, corresponding to a current sharing DCDC converter connected to the $i^{th}$ cell array in series is determined according to the target voltage $U_{dcStd}$ and the actually measured cell array voltage $U_{bat}i$, that is, $U_{obj}i=U_{dcStd}-U_{bat}i$; and finally, a low-voltage output side of each non-isolated DCDC converter is controlled to be started with a constant voltage, that is, a total voltage of non-isolated DCDC converters and cell arrays to which the non-isolated DCDC converters are connected in series in all cell array branches (that is, an output circuit of the cell array branches) is adjusted to the target voltage $U_{dcStd}$ via adjusting a duty cycle of an $i^{th}$ non-isolated DCDC converter according to the voltage sharing voltage correction value $U_{obj}i$, and switch contactors are controlled to be turned off, to achieve non-inrush current paralleling.

Figure 6:
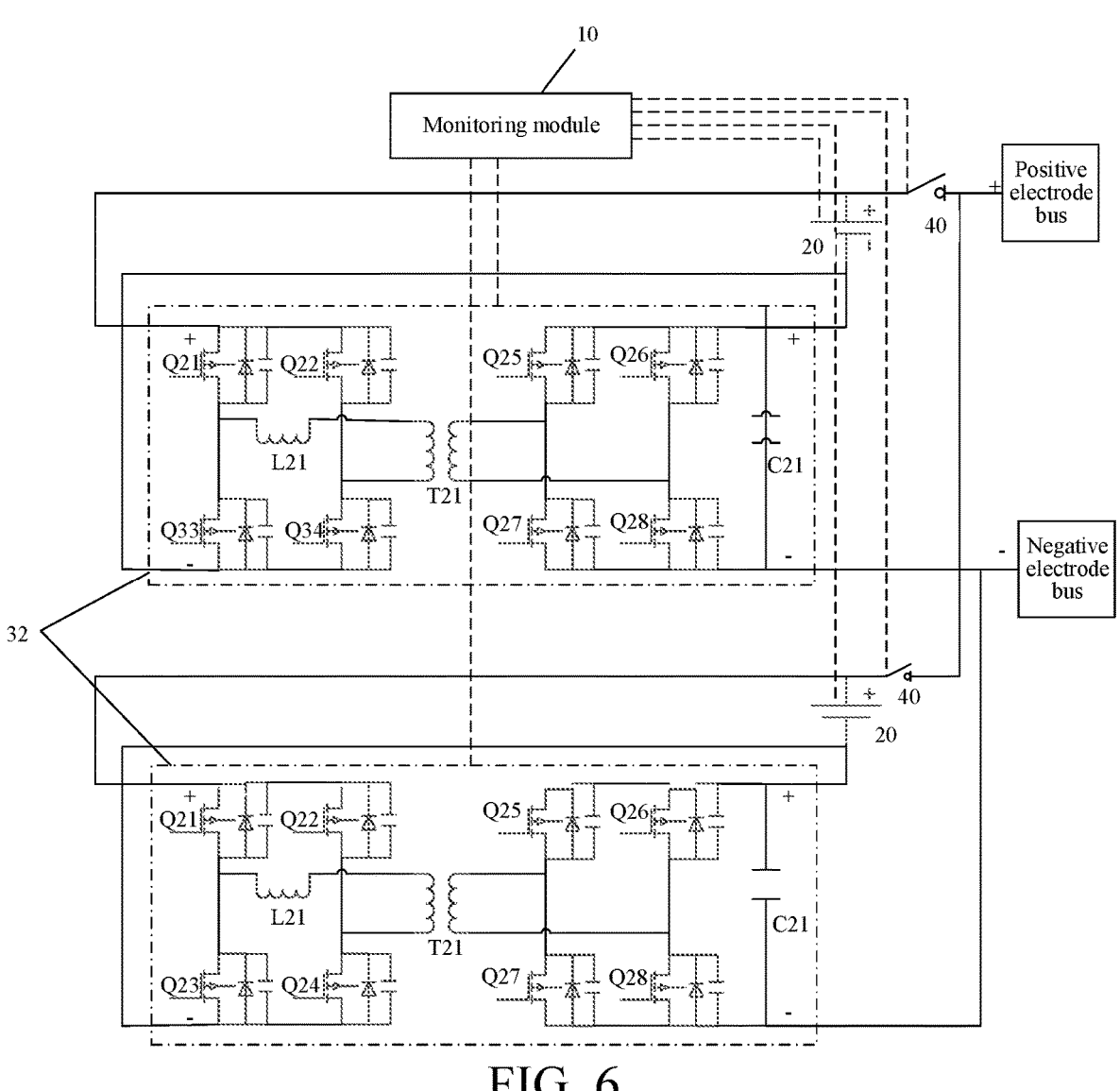
FIG. 6 is another schematic circuit diagram of a battery current sharing control system according to an embodiment of the present disclosure.

For example, in an example shown in FIG. 6, before cell arrays with different initial capacities and different internal resistances are connected in parallel, the monitoring module first controls a switch contactor connected to an $i^{th}$ cell array in series to be turned off, and acquires an actually measured cell array voltage $U_{bat}i$ corresponding to the $i^{th}$ cell array, where $1 \leq i \leq n$, and n is a quantity of cell arrays; determines a maximum voltage value in n actually measured cell array voltages $U_{bat}i$ as a target voltage $U_{dcStd}$, that is, $U_{dcStd}$=max $[U_{bat}i]$; then determines a voltage sharing voltage correction value $U_{obj}i$, corresponding to a current sharing DCDC converter connected to the $i^{th}$ cell array in series according to the target voltage $U_{dcStd}$ and the actually measured cell array voltage $U_{bat}i$, that is, $U_{obj}i=U_{dcStd}-U_{bat}i$; and finally, controls a low-voltage output side of each isolated DCDC converter to be started with a constant voltage, that is, adjusts a total voltage of isolated DCDC converters and cell arrays to which the isolated DCDC converters are connected in series in all cell array branches (that is, an output voltage sharing voltage correction value of each of the cell array branches) to the target voltage $U_{dcStd}$ via adjusting a duty cycle of an $i^{th}$ isolated DCDC converter according to the voltage sharing voltage correction value $U_{obj}i$, and switch contactors are controlled to be turned off, to achieve non-inrush current paralleling.

In this embodiment, before cell arrays are connected to a bus in parallel, an actually measured cell array voltage acquired corresponding to each cell array and a determined target voltage may be used to determine a voltage sharing voltage correction value based on the target voltage and the actually measured cell array voltage, and current sharing DCDC converters may be controlled according to the voltage sharing voltage correction value to adjust the duty cycle, to achieve current sharing of output currents for adjusting the cell arrays, thereby reducing a capacity loss caused by connecting the cell arrays in parallel, and avoiding energy caused by internal circulation after charge/discharge.

S132: The output voltage of each of the cell array branches is adjusted to the target voltage via adjusting a duty cycle of each of the current sharing DCDC converters based on a voltage sharing voltage correction value corresponding to the current sharing DCDC converter.

In this example, the controller forms a PWM signal based on a voltage sharing voltage correction value corresponding to each of the current sharing DCDC converters, and transmits the PWM signal to the current sharing DCDC converters to adjust the output voltage of the current sharing DCDC converters to an expected voltage sharing voltage correction value via adjusting the duty cycle of each of the current sharing DCDC converters, and before the cell arrays are connected in parallel, the output voltage of each of the cell array branch formed by the cell array and the current sharing DCDC converter connected to the cell array in series follows the target voltage of each of the cell array branch, to achieve voltage sharing control before the cell arrays are connected in parallel, thereby ensuring non-inrush current paralleling during subsequent parallel connection of the cell arrays.

As shown in FIG. 6, in a first bridge rectifier circuit on a high-voltage input side of the isolated DCDC converter, Q1 is conductive with Q3 in a complementary manner, and Q2 is conductive with Q4 in a complementary manner, both of which having a duty cycle of 50%. In a second bridge rectifier circuit on a low-voltage input side, Q5 is conductive with Q7 in a complementary manner, and Q6 is conductive with Q8 in a complementary manner, both of which having a duty cycle of 50%. The function of boosting or bucking may be implemented by changing an angular difference between the high-voltage input side and the low-voltage output side, to implement the function of current output or absorption. For example, an initial phase difference Angle_std may be set to 180° in a case that an output voltage of the isolated DCDC converter on the low voltage output side is expected to be gradually increased from 0V at an initial moment to a voltage sharing voltage correction value $U_{obj}i$, then an angular offset Angle=$(U_{obj}i-U_{bat}i)*(K_{p\_angle}+K_{i\_angle}/s)$+Angle_std is determined according to closed-loop PI adjustment, where $K_{p\_angle}$ is a preset rate coefficient for angular offset adjustment, $K_i$ is a preset integral coefficient for angular offset adjustment, S is a frequency domain, and the angular offset Angle is in a range of 90° to 270°. In this way, operations of drive switch transistors in the isolated DCDC converters may be adjusted based on the angular offset Angle, and a total voltage of isolated DCDC converters and cell arrays to which the isolated DCDC converters are connected in series in all cell array branches (that is, an output voltage of the cell array branches) is adjusted to the target voltage $U_{dcStd}$ via adjusting a duty cycle of an $i^{th}$ isolated DCDC converter according to the voltage sharing voltage correction value $U_{obj}i$, to ensure that non-inrush current paralleling is achieved in a case that all switch contactors are controlled to be turned off to cause the cell arrays to be connected to the bus in parallel.

S14: An actually measured cell array current corresponding to each of cell arrays is acquired.

The actually measured cell array current is a current of a cell array branch acquired in real time.

When the cell array branches are connected to the bus in parallel, current sharing output of the cell array branches cannot be ensured in a case that the current sharing DCDC converters perform current sharing control still by using the target voltage. This is because the total voltage of the cell array branches is identical, but there is a difference in internal resistances of different cell array branches. In a charging/discharging process, since I=U/R, an output current of each cell array branch may be inversely proportional to an internal resistance thereof. Therefore, current sharing control also needs to be performed in a case that all cell array branches are connected to the bus in parallel, to correct an output voltage of each current sharing DCDC converter, thereby ensuring current sharing output of the cell array branches in the charging/discharging process. Therefore, after adjusting an output voltage of each of the cell array branches to the target voltage via adjusting the current sharing DCDC converters based on the target voltage and the actually measured cell array voltage, to control the cell arrays to achieve non-inrush current paralleling, the controller needs to acquire actually measured cell array currents corresponding to the cell arrays in real time, so that current sharing control after the cell arrays are connected in parallel is achieved by using the actually measured cell array currents.

S15: A target current of all cell arrays is determined based on actually measured cell array currents corresponding to all the cell arrays.

The target current is a to-be-adjusted current expected by cell array branches formed by the cell arrays and the current sharing DCDC converters connected to the cell arrays in series. Since the cell array branch includes cell arrays connected in series and current sharing DCDC converters, the target battery may be a current expected by the cell arrays or the current sharing DCDC converters.

In an example, in step S15, the determining the target current of all the cell arrays based on the actually measured cell array currents corresponding to all the cell arrays includes: determining an average current of the actually measured cell array currents corresponding to all the cell arrays as the target current of all the cell arrays based on the actually measured cell array currents corresponding to all the cell arrays. For example, the controller may calculate an average current of n actually measured cell array currents, and determine a target current $I_{obj}i$ corresponding to an $i^{th}$ cell array, that is, $$I_{obj}i = \frac{1}{n}\sum_{i=1}^{n}I_{bat}i.$$

In an example, in step S15, the determining the target current of all the cell arrays based on the actually measured cell array currents corresponding to all the cell arrays includes: calculating a charge/discharge rate coefficient based on current cell array capacities corresponding to all the cell arrays and a current charge/discharge limit value; and determining the target current of all the cell arrays based on the actually measured cell array currents corresponding to all the cell arrays and the charge/discharge rate coefficient.

In an example, in a process of discharging cell arrays, a discharge rate coefficient $I_{Discharge}Rate\_i$ needs to be calculated according to a current battery capacity SOC_i and a current discharge limit value $I_{Discharge}Lim\_i$ corresponding to an $i^{th}$ cell array, that is, $$I_{Discharge}Rate\_i = SOC\_i * I_{Discharge}Lim\_i \Big/ \sum_{n}^{1}SOC\_i * I_{Discharge}Lim\_i.$$

$I_{Discharge}Rate\_i$ is a discharge rate coefficient of the $i^{th}$ cell array, SOC_i is a current battery capacity of the $i^{th}$ cell array, and $I_{Discharge}Lim\_i$ is a current discharge limit value of the $i^{th}$ cell array. Further, a target current $I_{obj}i$ of the $i^{th}$ cell array is determined based on n actually measured cell array currents $I_{bat}i$ and the discharge rate coefficient $I_{Discharge}Rate\_i$, that is, $$I_{obj}i = I_{Discharge}Rate\_i * \sum_{n}^{1}I_{bat}i.$$

In an example, in a process of charging cell arrays, a charge rate coefficient $I_{charge}Rate\_i$ needs to be calculated according to a current battery capacity SOC_i and a current charge limit value $I_{charge}Lim\_i$ corresponding to an $i^{th}$ cell array, that is, $$I_{charge}Rate\_i = (1 - SOC\_i) * I_{charge}Lim\_i \Big/ \sum_{n}^{1}(1 - SOC\_i) * I_{charge}Lim\_i.$$

$I_{charge}$Rate_i is a charge rate coefficient of the $i^{th}$ cell array, SOC_i is a current battery capacity of the $i^{th}$ cell array, and $I_{charge}$Lim_i is a current charge limit value of the $i^{th}$ cell array. Further, a target current $I_{obj}i$ of the $i^{th}$ cell array is determined based on n actually measured cell array currents $I_{bat}i$ and the charge rate coefficient $I_{charge}$Rate_i, that is, $$I_{obj}i = I_{charge}\text{Rate\_i} * \sum\nolimits_{n}^{1} I_{bat}i.$$

S16: An output current of each of the cell array branches is adjusted to the target current via adjusting the current sharing DCDC converters based on the actually measured cell array currents corresponding to all the cell arrays and the target current.

In this example, the controller may form, according to the target current and the actually measured cell array current corresponding to each of the cell arrays, a PWM signal of the current sharing DCDC converters for controlling to connect to the cell arrays in series, and transmit the PWM signal to the current sharing DCDC converters to adjust the output current of each of the cell array branches to the target current via adjusting a duty cycle of each of the current sharing DCDC converters, and after the cell array branches are connected to the bus in parallel, the output current of each of the cell array branches formed by the cell array and the current sharing DCDC converters connected to the cell arrays in series follows the target current to achieve current sharing control after the cell array branches are connected in parallel, thereby reducing a capacity loss caused by connecting the cell arrays in parallel, and avoiding energy caused by internal circulation after charge/discharge.

In an embodiment, the adjusting the output current of each of the cell array branches to the target current via adjusting the current sharing DCDC converters based on the actually measured cell array currents corresponding to all the cell arrays and the target current includes the following steps:

S161: A current sharing voltage correction value corresponding to a current sharing DCDC converter connected to each of the cell arrays in series is obtained by using a formula, where the formula is $\text{Dalta}U_{obj}i = (I_{bat}i - I_{obj}i) * (K_p + K_i/s)$, $\text{Dalta}U_{obj}i$ is a current sharing voltage correction value of an $i^{th}$ cell array, $I_{bat}i$ is an actually measured cell array current of the $i^{th}$ cell array, $I_{obj}i$ is a target current of the $i^{th}$ cell array, $K_p$ is a preset rate coefficient, $K_i$ is a preset integral coefficient, and s is a frequency domain.

The current sharing voltage correction value is a to-be-adjusted voltage expected by the current sharing DCDC converters after the cell array branches are controlled in parallel, to achieve current sharing control of the output current of each of the cell array branches formed by the current sharing DCDC converters and the cell arrays connected to the current sharing DCDC converters in series.

In this example, after obtaining the actually measured cell array currents corresponding to all cell arrays and the target current, the controller may invoke pre-stored conversion logic for calculating current sharing voltage correction values based on the actually measured cell array currents and the target current, perform processing on the actually measured cell array currents and the target current by using the conversion logic to determine current sharing voltage correction values corresponding to current sharing DCDC converters connected to the cell arrays in series, and dynamically adjust output voltages of the current sharing DCDC converters based on the current sharing voltage correction values to change a total voltage of an overall cell array branch, thereby achieving current sharing output of the cell array branches.

S162: The output current of each of the cell array branches is adjusted to the target current via adjusting a duty cycle of each of the current sharing DCDC converters is adjusted based on a current sharing voltage correction value corresponding to the current sharing DCDC converter.

In this example, after obtaining the current sharing voltage correction values, the controller forms a corresponding PWM signal based on the current sharing voltage correction values, and adjusts the duty cycle of the current sharing DCDC converters based on the PWM signal, to achieve current sharing control of output currents of cell array branches formed by the cell arrays and the current sharing DCDC converters connected to the cell array branches in series. For example, in a discharging process, an output current of the cell array branch is adjusted to the target current via reducing an output voltage by a current sharing DCDC converter on a cell array branch with a larger actually measured cell array current and increasing an output voltage by a current sharing DCDC converter on a cell array branch with a smaller actually measured cell array current increases an output voltage. In a charging process, an output current of the cell array branch is adjusted to the target current via increasing an output voltage by a current sharing DCDC converter on a cell array branch with a larger actually measured cell array current and reducing an output voltage via a current sharing DCDC converter on a cell array branch with a smaller actually measured cell array current.

In an example, after obtaining a current sharing voltage correction value corresponding to each current sharing DCDC converter, the controller needs to adjust an output current of each of the cell array branch to the target current via adjusting a duty cycle of the current sharing DCDC converter based on a current sharing voltage correction value and a voltage sharing voltage correction value corresponding to the current sharing DCDC converter. In other words, a difference between the current sharing voltage correction value and the voltage sharing voltage correction value corresponding to the current sharing DCDC converter is determined as a current sharing voltage variation value, and the output current of the cell array branch is adjusted to the target current via adjusting the duty cycle of the current sharing DCDC converter according to the current sharing voltage variation value.

For example, in the example shown in FIG. 5, the current sharing power supply is primarily configured to provide or absorb insufficient or redundant currents in a cell array branch on which each cell array is arranged, to achieve current sharing. An actually measured cell array current $I_{bat}i$ corresponding to the $i^{th}$ cell array is set to be acquired after a switch contactor $C_i$ connected to the $i^{th}$ cell array in series is controlled to be turned off, that is, after the cell arrays are connected in parallel, where $1 \leq i \leq n$, n is a quantity of cell arrays, and in this example, n is specifically a quantity of cell arrays connected to a bus in parallel. Then, an average current of n actually measured cell array currents $I_{bat}i$ is calculated to determine a target current $I_{obj}i$ of an $i^{th}$ cell array, that is, $$I_{obj}i = \frac{1}{n}\sum_{i=1}^{n} I_{bat}i.$$

Alternatively, a corresponding charge/discharge rate coefficient is first calculated according to a current cell array capacity of the $i^{th}$ cell array and a current charge/discharge limit value, and then a target current $I_{obj}i$ of all cell arrays is determined based on actually measured cell array currents of all the cell arrays and the charge/discharge rate coefficient. Then, a current sharing voltage correction value $DaltaU_{obj}i$ of an $i^{th}$ current sharing DCDC converter is determined by using $DaltaU_{obj}i=(I_{bat}i-I_{obj}i)*(K_p+K_i/s)$ according to the actually measured cell array current $I_{bat}i$ and the target current $I_{obj}i$. Further, a current sharing voltage variation value $U_{obj}i'$ is determined according to a current sharing voltage correction value $DaltaU_{obj}i$ and a voltage sharing voltage correction value $U_{obj}i$, where $U_{obj}i'=U_{obj}i-DaltaU_{obj}i$. Finally, a corresponding adjustment drive signal is determined according to the current sharing voltage variation value $U_{obj}i'$, and the current sharing DCDC converters are controlled based on the adjustment drive signal to adjust a duty cycle, to achieve current sharing control. In other words, in a discharging process, an output current of the cell array branch is adjusted to the target current via reducing an output voltage by a current sharing DCDC converter on a cell array branch with a larger actually measured cell array current and increasing an output voltage by a current sharing DCDC converter on a cell array branch with a smaller actually measured cell array current. In a charging process, an output current of the cell array branch is adjusted to the target current via increasing an output voltage by a current sharing DCDC converter on a cell array branch with a larger actually measured cell array current and reducing an output voltage by a current sharing DCDC converter on a cell array branch with a smaller actually measured cell array current. In this example, insufficient currents in the cell array branches during discharge are provided by the current sharing power supply. In the charging process, redundant currents in any cell array branch are injected into the current sharing power supply, which requires that internal resistances of cell array branches are different and dynamically changed. However, the cell array branches may be dynamically adjusted by adjusting a duty cycle of each current sharing DCDC converter, to achieve current sharing control. An implementation of an example shown in FIG. 6 is the same as the implementation of the example shown in FIG. 5. To avoid repetition, the details are not repeated herein.

In the battery current sharing control method provided in this embodiment, before cell arrays are connected in parallel, an output voltage of each of cell array branches is adjusted to the target voltage via adjusting a duty cycle of each of current sharing DCDC converters based on an actually measured cell array voltage corresponding to each of the cell arrays and a target voltage corresponding to all cell arrays, thereby achieving non-inrush current paralleling. After the cell arrays are connected in parallel, an output current of each of the cell array branches is adjusted to the target current via adjusting the duty cycles of the current sharing DCDC converters based on actually measured cell array currents corresponding to all cell arrays and a target current. In this way, current sharing control is achieved, a capacity loss of the cell arrays caused by connecting in parallel is reduced, battery capacity utilization of the cell arrays is improved, and an energy loss caused by internal circulation after charge/discharge may be reduced, thereby ensuring a service life of the cell arrays connected in parallel, and ensuring safety in a process of charging/discharging the cell arrays.

In an embodiment, as shown in FIG. 2, before step S14, that is, before the acquiring the actually measured cell array current corresponding to each of the cell arrays, the battery current sharing control method further includes:

S21: Actually measured branch voltages corresponding to all cell arrays are acquired in real time.

The actually measured branch voltage corresponding to the cell array branch may be a sum of actually measured cell array voltages of the cell arrays and actually measured converter voltages of the current sharing DCDC converters in the cell array branch.

S22: In a case that the actually measured branch voltages corresponding to all the cell arrays are within an allowable error range of the target voltage, all cell array branches are controlled to be connected to a bus in parallel.

In this example, after obtaining the actually measured branch voltage corresponding to the cell array branch, the controller first determines whether actually measured branch voltages corresponding to all cell array branches are within the allowable error range of the target voltage. All the cell array branches are connected to the bus in parallel in a case that the actually measured branch voltages corresponding to all the cell array branches are within the allowable error range of that target voltage, to achieve non-inrush current paralleling. In this case, the actually measured branch voltages corresponding to all the cell arrays being within the allowable error range of the target voltage may be a condition for controlling all the cell array branches to be connected to the bus in parallel, which can ensure that there is no inrush current during parallel connection.

In an embodiment, as shown in FIG. 3, after step S22, that is, after the controlling all the cell array branches to be connected to the bus in parallel, the battery current sharing control method further includes the following steps:

S31: Current cell array capacities corresponding to all the cell array branches are acquired in real time, and whether the current cell array capacities are between a lower-limit cell array capacity and an upper-limit cell array capacity is determined.

The current cell array capacity is a battery capacity of the cell arrays acquired in real time. The upper-limit cell array capacity is a maximum capacity that the cell arrays can be normally charged or discharged. The lower-limit cell array capacity is a minimum capacity that the cell arrays can be normally discharged or charged.

S32: In a case that a current cell array capacity corresponding to any one of the cell array branches is not between the lower-limit cell array capacity and the upper-limit cell array capacity, the cell array branch is disconnected from the bus, and the step of acquiring the actually measured cell array voltage corresponding to each of the cell arrays is repeatedly performed.

In this example, after acquiring current cell array capacities corresponding to all cell array branches in real time, the controller first determines whether each current cell array capacity is between a lower-limit cell array capacity and an upper-limit cell array capacity. In a case that the current cell array capacity is between the lower-limit cell array capacity and the upper-limit cell array capacity, it is determined that the cell array branch may be normally charged or discharged in this case, and no additional adjustment is required. In a case that the current cell array capacity is not between the lower-limit cell array capacity and the upper-limit cell array capacity, it is determined that the cell array branch may not be normally charged or discharged in this case. In view of this, the cell array branch needs to be disconnected from the bus, that is, switch contactors in the cell array branch are turned off to shut down the current sharing DCDC converters, to prevent a cell array branch whose current cell array capacity is not between the lower-limit cell array capacity and the upper-limit cell array capacity from being connected to the bus, affecting accuracy and reliability of current sharing adjustment. In this example, after the cell array branch is disconnected from the bus, the step of acquiring the actually measured cell array voltage corresponding to each of the cell arrays is repeatedly performed, that is, step S11 is repeatedly performed.

An embodiment of the present disclosure provides a battery current sharing control system. As shown in FIG. 4, the battery current sharing control system includes a monitoring module 10 and multiple cell array branches arranged on a bus in parallel, where each of the cell array branches includes a cell array 20 and a current sharing DCDC converter 30 connected to the cell array 20, and the monitoring module 10 is connected to the cell arrays 20 and the current sharing DCDC converters 30 and is configured to acquire cell array state information of the cell array branches, and adjust a duty cycle of each of the current sharing DCDC converters 30 based on the cell array state information, to achieve current sharing control.

The cell array branches are branches connected to the bus in parallel, and each cell array branch includes cell arrays 20 and current sharing DCDC converters 30 connected in series.

The cell array 20 may be a single energy storage battery, or may be formed by multiple energy storage cell arrays 20 connected in parallel. The energy storage battery may be a battery that may be repeatedly charged or discharged, such as a lithium iron phosphate, a ternary lithium battery, and the like. At least two cell arrays 20 are arranged on the bus in parallel to form a battery module. In this example, battery current sharing control may implement current sharing adjustment on output currents of the at least two cell arrays 20 in the battery module, to prevent a part of the cell arrays 20 from being in an overcharged or over-discharged state for a long time, causing inconsistency of the at least two cell arrays 20 in the battery module, thereby effectively avoiding deterioration of the battery.

The current sharing DCDC converter 30 is a DCDC converter configured to implement current sharing of output currents of the cell arrays 20. It may be understood that, the current sharing DCDC converter 30 is a bidirectional DCDC converter that can not only increase output currents of the cell arrays 20, but also reduce the output currents of the cell arrays 20.

In this example, a current sharing DCDC converter 30 and a cell array 20 are connected in series to form a cell array branch. In a case that there are n cell arrays 20 in the battery module, n current sharing DCDC converters 30 are respectively connected to the n cell arrays 20 in series to form n cell array branches, and each current sharing DCDC converter 30 adjusts an output voltage thereof to ensure current sharing output of the cell arrays 20 in the cell array branches in a charging/discharging process.

Further, each cell array branch further includes a switch contactor 40 configured to control whether to connect the cell array branch to the bus. The switch contactor 40 is a switch that is connected to a cell array 20 and is configured to control whether to connect the cell array 20 to the bus. In this example, each current sharing DCDC converter 30 is connected to a cell array 20 and a switch contactor 40 in series to form a cell array branch. The switch contactor 40 is arranged on the cell array branch to control whether to connect the cell array branch to the bus.

The monitoring module 10 is a module in the battery current sharing control system and is configured to implement a monitoring processing function. In an example, a current sharing control program for implementing monitoring processing function is pre-stored in the monitoring module 10. The monitoring module 10 perform processing by executing the current sharing control program to control the current sharing DCDC converters 30 connected to the cell arrays 20 in series to adjust a duty cycle, to adjust an output current of each cell array 20, thereby achieving current sharing output.

In an example, the monitoring module 10 includes sampling circuits and controllers connected to the sampling circuits. The sampling circuits are connected to the cell arrays 20 and the current sharing DCDC converters 30 and are configured to acquire cell array state information of each of the cell array branches on which the cell array 20 and the current sharing DCDC converter 30 are arranged, and feedback the cell array state information to the controller. The cell array state information includes, but is not limited to, an actually measured cell array voltage, an actually measured cell array current, a current cell array capacity, an actually measured converter voltage, an actually measured converter current, a bus voltage, and the like. The controller is also connected to the current sharing DCDC converters 30 and is configured to perform comprehensive calculation and determination processing on the cell array state information to form a PWM signal. A duty cycle of each of the current sharing DCDC converters may be adjusted by controlling the current sharing DCDC converters 30 by using the PWM signal, and an output current of each of the cell arrays 20 is adjusted, to achieve current sharing output. In this example, the controller is specifically a digital signal processor, that is, a DSP.

Using a battery module formed by connecting three cell arrays 20 in parallel in FIG. 4 as an example, in a case that factors such as manufacturing processes, usage conditions, and the like are different, internal resistances and capacities of the three cell arrays 20 may deviate after a period of time. In this case, in a case that the three cell arrays 20 are directly connected in parallel for charging/discharging, output currents may greatly differ in a charging/discharging process due to different resistances. As a result, the battery cannot be fully charged or discharged at the same time, causing a large capacity loss. In addition, in a later charging/discharging stage, the internal resistance rapidly increases, but cell arrays 20 have different increase rates. As a result, charge/discharge currents of a part of the cell arrays 20 may sharply increase or even exceed an allowable range of the battery, resulting in a shortened service life of the cell arrays 20, and even a safety accident such as fire. To overcome the existing problem caused by directly connecting the at least two cell arrays 20 to the bus in parallel, a current sharing DCDC converter 30 is connected to each cell array 20 in series to form a cell array branch, and the monitoring module 10 is connected to the cell array 20 and the current sharing DCDC converter 30. Cell array state information of the cell array branch is acquired, and comprehensive calculation and determination processing are performed on the cell array state information, so that a PWM may be formed. The current sharing DCDC converters 30 may be controlled according to the PWM signal to adjust a duty cycle, to achieve current sharing of output currents of the cell arrays 20. In this way, the problem caused by inconsistent output currents in a process of charging/discharging the at least two cell arrays 20 may be avoided, and battery capacity utilization may be improved, thereby ensuring a service life of each cell array 20 in the battery module, and ensuring safety of each cell array 20 in the charging/discharging process. A switch contactor 40 is further arranged on each cell array branch. The switch contactor 40 is connected to the controller and is controlled by the controller, that is, the controller may control, according to an actual condition, the switch contactor 40 on the cell array branch to be turned off or disconnected, so that a cell array branch on which the cell array 20 is arranged is connected to the bus, to further execute a corresponding current sharing control perform. In this way, a service life of each cell array 20 in the battery module, may be ensured, and safety of each cell array 20 in the charging/discharging process may be ensured.

In the battery current sharing control system provided in this embodiment, each cell array 20 and each current sharing DCDC converter 30 are connected in series to form a cell array branch. Cell array state information of the cell array branch is acquired by a monitoring module 10, and the cell array state information is processed to further control the current sharing DCDC converter 30 to adjust a duty cycle thereof, to adjust an output current of the cell array 20, thereby achieving current sharing of cell array branches connected in parallel. In this way, the capacity loss of the cell arrays 20 caused by connecting in parallel is reduced, the battery capacity utilization of the cell arrays 20 is improved, and the energy loss caused by internal circulation after charge/discharge may be reduced, thereby ensuring the service life of the cell arrays 20 connected in parallel, and ensuring the safety in the process of charging/discharging the cell arrays 20.

In an embodiment, in the related art, non-isolated DCDC converters 31 are arranged between the cell arrays 20 and the bus to achieve current sharing. In other words, one side of the non-isolated DCDC converters 31 is connected to multiple cell arrays 20 connected in parallel, and the other side is connected to the bus. The non-isolated DCDC converters 31 output constant currents, so that the currents of the multiple cell arrays 20 are equalized. However, such a manner has the following shortcomings: both sides of the non-isolated DCDC converters 31 have hundreds of volts of high voltage, and consequently, devices on both sides of the DCDC converter have a high withstand voltage level, which is costly and is likely to be damaged.

To overcome the shortcomings in the related art in which the non-isolated DCDC converters 31 are directly connected to the bus and the cell arrays 20. As shown in FIG. 5, the battery current sharing control system further includes a current sharing power supply 50; the current sharing DCDC converter 30 is a non-isolated DCDC converter 31 connected to the current sharing power supply 50; an input terminal of the non-isolated DCDC converter 31 is connected to the current sharing power supply 50; and an output terminal of the current sharing DCDC converter 30 is connected to the cell array 20 and the bus.

A first input terminal of each of the current sharing DCDC converter 30 is connected to the current sharing power supply 50, and a second input terminal is connected to the current sharing power supply 50; the first output terminal of each of the current sharing DCDC converters 30 is connected to the cell array 20, and the second output terminal is connected to the bus; or the first output terminal of each of the current sharing DCDC converters 30 is connected to the bus, and the second output terminal is connected to the cell array 20.

The non-isolated DCDC converter 31 is a DCDC converter whose output GND is related to output GND. The non-isolated DCDC converter 31 may be a boost converter or a buck converter.

The current sharing power supply 50 is a power supply for achieving current sharing. In this example, the current sharing power supply 50 is connected to an alternating current power supply through an alternating current contactor. The current sharing power supply 50 is configured to receive an alternating current inputted by an alternating current power grid, and convert the alternating current into a direct current to be provided to the non-isolated DCDC converters 31 and the cell arrays 20, so that the cell arrays 20 may complete a charge/discharge operation. In an example, the current sharing power supply 50 may adopt an uncontrolled rectifier source or a bi-directional direct current source (that is, ACDC). In this example, an alternating current side of the current sharing power supply 50 is connected to the alternating current power grid, and a direct current side is connected to the cell array 20 through the non-isolated DCDC converter 31.

Specifically, a first input terminal of each of the current sharing DCDC converter 30 is connected to the current sharing power supply 50, and a second input terminal is connected to the current sharing power supply 50; the first output terminal of each of the current sharing DCDC converters 30 is connected to the cell array 20, and the second output terminal is connected to the bus; or the first output terminal of each of the current sharing DCDC converters 30 is connected to the bus, and the second output terminal is connected to the cell array 20. As shown in FIG. 5, a first input terminal (that is, a positive electrode input terminal) and a second input terminal (that is, a negative electrode input terminal) of each of the non-isolated DCDC converters 31 are connected to the current sharing power supply 50. A first output terminal (that is, a positive output terminal) is connected to the cell array 20, and a second output terminal (that is, a negative output terminal) is connected to the bus. Alternatively, the first output terminal (that is, the positive output terminal) is connected to the bus, and the second output terminal (that is, the negative output terminal) is connected to the cell array 20. In this case, two input terminals of each of the non-isolated DCDC converters 31 is connected to the current sharing power supply 50, which are on a high-voltage input side. Two output terminals of each of the non-isolated DCDC converters 31 are respectively connected to the cell array 20 and the bus, which are on a low-voltage output side. It may be understood that, high-voltage input sides of all the non-isolated DCDC converters 31 are connected to the current sharing power supply 50, and low-voltage output sides are connected to the cell arrays 20. In such a manner, the existing shortcomings caused by the non-isolated DCDC converters 31 being respectively connected to the cell arrays 20 and the bus may be avoided, and voltages at input terminals and output terminals of the non-isolated DCDC converters 31 may be effectively reduced without using devices with a higher withstand voltage level, thereby reducing circuit costs and ensuring a service life of circuits. In this example, the current sharing power supply 50 is connected to at least two non-isolated DCDC converters 31 to provide energy required for current sharing, to control the non-isolated DCDC converters 31 to achieve current sharing control. Since the input terminals of the non-isolated DCDC converters 31 are connected to the current sharing power supply 50, and the energy required for current sharing is obtained, so that devices with a lower withstand voltage level may be used in the non-isolated DCDC converters 31, which is highly reliable and not likely to be damaged.

In an embodiment, as shown in FIG. 5, the non-isolated DCDC converter 31 includes a first resonant inductance L11, a first drive power tube Q11, a second drive power tube Q12, a first reverse diode D11, a second reverse diode D12, a first energy storage capacitor C11, and a second energy storage capacitor 12. The first resonant inductance L11 and the first drive power tube Q11 are arranged in series between the first input terminal and the first output terminal. One end of the first energy storage capacitor C11 is connected to the first resonant inductance L11 and the first drive power tube Q11, and the other end is connected to the second input terminal and the second output terminal. One end of the second drive power tube Q12 is connected to the first drive power tube Q11 and the first output terminal, and the other end is connected to the second input terminal and the second output terminal. One end of the second energy storage capacitor 12 is connected to the first drive power tube Q11 and the first output terminal, and the other end is connected to the second input terminal and the second output terminal. The first reverse diode D11 and the first drive power tube Q11 are reversely connected in parallel. The second reverse diode D12 and the second drive power tube Q12 are reversely connected in parallel.

The first resonant inductance L11 is an inductance arranged in the non-isolated DCDC converter 31, which may play a resonant role and improve the efficiency of DCDC conversion.

The first drive power tube Q11 and the second drive power tube Q12 are power tubes arranged on the non-isolated DCDC converter 31, which may specifically adopt MOSFET and IGBT. In this example, the first drive power tube Q11 and the second drive power tube Q12 are connected to the monitoring module 10, to be conductive with each other in a complementary manner under the control of the monitoring module 10. That is, the second drive power tube Q12 is disconnected in a case that the first drive power tube Q11 is connected, and the second drive power tube Q12 is connected in a case that the first drive power tube Q11 is disconnected.

The reversely parallel connection of the first reverse diode D11 and the first drive power tube Q11 means that the first reverse diode D11 is connected to the first drive power tube Q11 in parallel, and a current flowing through the first drive power tube Q11 and a current flowing through the first reverse diode D11 are reverse, so that the first reverse diode D11 may play a role of enduring current flowing in a case that the first drive power tube Q11 is turned off. The reversely parallel connection of the second reverse diode D12 and the second drive power tube Q12 means that the second reverse diode D12 is connected to the second drive power tube Q12 in parallel, and a current flowing through the second drive power tube Q12 and a current flowing through the second reverse diode D12 are reverse, so that the second reverse diode D12 may play a role of enduring current flowing in a case that the second drive power tube Q12 is turned off.

The first energy storage capacitor C11 and the second energy storage capacitor 12 are capacitors arranged in the non-isolated DCDC converter 31 for achieving storage and release of electrical energy during charge/discharge.

In this example, after acquiring cell array state information, the monitoring module 10 perform comprehensive calculation and determination processing on the cell array state information to form a current sharing drive signal, controls on or off of the first drive power tube Q11 and the second drive power tube Q12 connected to the monitoring module based on the current sharing drive signal, and adjusts an PWM duty cycle through PI, to control the non-isolated DCDC converter 31 to adjust an output current of a corresponding cell array 20, to achieve current sharing. In this way, a problem caused by inconsistent currents of the cell arrays 20 in a charging/discharging process may be avoided, thereby improving the battery capacity utilization rate, ensuring a service life of each of the cell arrays 20 in a battery module, and ensuring the safety in charging/discharging process of the cell arrays 20. In this example, the current sharing power supply 50 is connected to non-isolated DCDC converters 31 to provide energy required for current sharing, to control the non-isolated DCDC converters 31 to achieve current sharing. Since the energy required for current sharing is obtained without connecting the non-isolated DCDC converters 31 to the bus, so that devices with a lower withstand voltage level may be used in the non-isolated DCDC converters 31, for example, inductance, capacitance, and power switch transistors, and the like, which are highly reliable and not likely to be damaged.

In an embodiment, as shown in FIG. 6, the current sharing DCDC converter 30 is an isolated DCDC converter 32; an input terminal of each of the isolated DCDC converters 32 is connected to the cell array 20; and an output terminal of each of the isolated DCDC converters 32 is connected to the cell array 20 and the bus.

The isolated DCDC converter 32 is a DCDC converter whose output GND is independent of input GND. In this example, both a first input terminal and a second input terminal of the isolated DCDC converter 32 are connected to the cell array 20, a first output terminal and a second output terminal of the isolated DCDC converter 32 are respectively connected to the cell array 20 and the bus, so that the cell array 20 is a current sharing power supply 50 of the isolated DCDC converter 32 without additionally adding a current sharing power supply 50, and the isolated DCDC converter 32 is controlled by the monitoring module 10 to adjust an output battery of the cell array 20, to achieve current sharing control of at least two cell arrays 20.

In this example, an isolated DCDC converter 32 connected to each of the cell arrays 20 is connected to the monitoring module 10, so that an output current of each of the cell arrays 20 may be adjusted under the control of the current sharing drive signal of the monitoring module 10, to achieve current sharing of at least two cell arrays 20 connected in parallel, thereby reducing a capacity loss caused by parallel connection and an energy loss caused by internal circulation after charge/discharge. Since two input terminals of each isolated DCDC converter 32 are connected to the cell array 20, and the energy required for current sharing is provided through the cell array 20, the input terminals have lower voltages, devices with a lower withstand voltage level may be used in the non-isolated DCDC converters 32, and there is no need to additionally add the current sharing power supply 50, thereby significantly reducing costs. Since the cell array 20 is used as the current sharing power supply 50 of the isolated DCDC converter 32, the other terminal may not be caused to be operated in a case that either of the input terminal and the output terminal of the isolated DCDC converter 32 is in an extreme working condition of short circuit, to avoid fault spread. Such a manner has high reliability.

In an embodiment, the first input terminal of each of the isolated DCDC converters 32 is connected to the cell array 20, and the second input terminal is connected to the cell array 20; the first output terminal of each of the isolated DCDC converters 32 is connected to the cell array 20, and the second output terminal is connected to the bus; or the first output terminal of each of the isolated DCDC converters 32 is connected to the bus, and the second output terminal is connected to the cell array 20. As shown in FIG. 6, the isolated DCDC converter 32 includes a high frequency transformer T21, a second resonant inductance L21, a first bridge rectifier circuit, a second bridge rectifier circuit, and a filter capacitor C21. The first bridge rectifier circuit is arranged on a primary side of the high frequency transformer T21 and is connected to the first input terminal and the second input terminal. The second bridge rectifier circuit is arranged on a secondary side of the high frequency transformer T21 and is connected to the first output terminal and the second output terminal. The second resonant inductance L21 is arranged between the primary side of the high frequency transformer T21 and the first bridge rectifier circuit. The filter capacitor C21 is arranged between the first output terminal and the second output terminal, and is connected to the second bridge rectifier circuit in parallel.

The first bridge rectifier circuit and the second bridge rectifier circuit are bridge rectifier circuits respectively arranged on the primary side and the secondary side of the high frequency transformer T21. The circuit is of a bridge structure formed by connecting four diodes, and the alternating current may be converted into a unidirectional pulsating direct current for rectification. The second resonant inductance L21 is an inductance arranged in the isolated DCDC converter 32, which can play a resonant role and improve efficiency of DCDC conversion. The filter capacitor C21 is a capacitor arranged in the isolated DCDC converter 32 and playing a filtering role, which is mainly used for filtering alternating current components in the unidirectional pulsating direct current.

In this example, both the first bridge rectifier circuit and the second bridge rectifier circuit are connected to the monitoring module 10 and are configured to perform processing according to the current sharing drive signal outputted by the monitoring module 10, to control on or off of each diode in the first bridge rectifier circuit and the second bridge rectifier circuit, so that duty cycles of the first bridge rectifier circuit and the second bridge rectifier circuit are adjusted, to achieve an effect of boosting and bucking, thereby achieving current sharing adjustment of output currents of the cell arrays 20. The first bridge rectifier circuit is connected to the high frequency transformer T21 through the first resonant inductance L11, and another end is connected to the cell array 20, to rectify currents inputted into the cell array 20. The second bridge rectifier circuit is connected to the cell array 20 and the bus and can input rectified currents into the cell array 20, to adjust an output current of the cell array 20.

In an embodiment, as shown in FIG. 6, the first bridge rectifier circuit includes a first drive switch transistor Q21 and a second drive switch transistor Q22 connected to the first input terminal, and a third drive switch transistor Q23 and a fourth drive switch transistor Q24 connected to the second input terminal. The first drive switch transistor Q21 is connected to the third drive switch transistor Q23, and the monitoring module 10 is connected to the first drive switch transistor Q21 and the third drive switch transistor Q23, to control the first drive switch transistor Q21 to be conducted to the third drive switch transistor Q23 in a complementary manner. The second drive switch transistor Q22 is connected to the fourth drive switch transistor Q24, and the monitoring module 10 is connected to the second drive switch transistor Q22 and the fourth drive switch transistor Q24, to control the second drive switch transistor Q22 to be conducted to the fourth drive switch transistor Q24 in a complementary manner. One end of the primary side of the high frequency transformer T21 is connected to the first drive switch transistor Q21 and the third drive switch transistor Q23 through the second resonant inductance L21, and the other end is connected to the second drive switch transistor Q22 and the fourth drive switch transistor Q24. The second bridge rectifier circuit includes a fifth drive switch transistor Q25 and a sixth drive switch transistor Q26 connected to the first output terminal, and a seventh drive switch transistor Q27 and an eighth drive switch transistor Q28 connected to the second output terminal. The fifth drive switch transistor Q25 is connected to the seventh drive switch transistor Q27, and the monitoring module 10 is connected to the fifth drive switch transistor Q25 and the seventh drive switch transistor Q27, to control the fifth drive switch transistor Q25 to be conducted to the seventh drive switch transistor Q27 in a complementary manner. The sixth drive switch transistor Q26 is connected to the eighth drive switch transistor Q28, and the monitoring module 10 is connected to the sixth drive switch transistor Q26 and the eighth drive switch transistor Q28, to control the sixth drive switch transistor Q26 to be conducted to the eighth drive switch transistor Q28 in a complementary manner. One end of the secondary side of the high frequency transformer T21 is connected to the fifth drive switch transistor Q25 and the seventh drive switch transistor Q27, and the other end is connected to the sixth drive switch transistor Q26 and the eighth drive switch transistor Q28. The first drive switch transistor Q21, the second drive switch transistor Q22, the third drive switch transistor Q23, the fourth drive switch transistor Q24, the fifth drive switch transistor Q25, the sixth drive switch transistor Q26, the seventh drive switch transistor Q27, and the eighth drive switch transistor Q28 are respectively connected to a reverse freewheeling diode and a filter capacitor C21 in parallel.

In this example, Q21, Q22, Q23, and Q24 form the first bridge rectifier circuit. The first bridge rectifier circuit is arranged on the primary side of the high frequency transformer T21 as a high-voltage input side of the isolated DCDC converter 32. The monitoring module 10 is connected to Q21, Q22, Q23, and Q24, and may control Q21 to be conducted to Q23 in a complementary manner and control Q22 to be conducted to Q24 in a complementary manner, so that a duty cycle of each drive switch transistor on the high-voltage input side of the isolated DCDC converter 32 is 50%. Q25, Q26, Q27 and Q28 form the second bridge rectifier circuit. The second bridge rectifier circuit is arranged on the secondary side of the high frequency transformer T21 as a low-voltage output side of the isolated DCDC converter 32. The monitoring module 10 is connected to Q25, Q26, Q27, and Q28, and is configured to control Q25 to be conducted to Q27 in a complementary manner and control Q26 to be conducted to Q28 in a complementary manner, so that a duty cycle of each drive switch transistor on the low-voltage output side of the isolated DCDC converter 32 is 50%. It may be understood that, modulation signals of the drive switch transistors on the high-voltage input side of the isolated DCDC converter 32 are the same as that of the drive switch transistors on the low-voltage output side, and the function of boosting or bucking may be implemented by adjusting an angular difference between the drive switch transistors on the high-voltage input side and the drive switch transistors on the low-voltage output side, to adjust output currents of the cell arrays 20, thereby achieving current sharing.

The foregoing embodiments are merely used for describing the technical solutions of the present disclosure, but are not intended to limit the present disclosure. Although the present disclosure has been described in detail with reference to the foregoing embodiments, a person of ordinary skill in the art should understand that, modifications may still be made to the technical solutions in the foregoing embodiments, or equivalent replacements may be made to some or all of the technical features, and such modifications or replacements without causing the essence of corresponding technical solutions to depart from the spirit and scope of the technical solutions of the embodiments of the present disclosure shall all fall within the protection scope of the present disclosure.

What is claimed is:

1. A battery current sharing control method, applied to a battery current sharing control system, wherein the battery current sharing control system comprises a plurality of cell array branches connected in parallel, and each of the cell array branches comprises a cell array and a current sharing DCDC converter serially connected to the cell array, the method comprising:

acquiring an actually measured cell array current corresponding to each of the cell arrays;

determining a target current of all cell arrays based on actually measured cell array currents corresponding to all the cell arrays; and adjusting an output current of each of the cell array branches to the target current via adjusting the current sharing DCDC converters based on the actually measured cell array currents corresponding to all the cell arrays and the target current, by adjusting a duty cycle of each of the current sharing DCDC converters based on a voltage correction value corresponding to the current sharing DCDC converter.

2. The battery current sharing control method according to claim 1, wherein before the acquiring the actually measured cell array current corresponding to each of the cell arrays, the battery current sharing control method further comprises:

acquiring an actually measured cell array voltage corresponding to each of the cell arrays;

determining a target voltage of all cell array branches; and adjusting an output voltage of each of the cell array branches to the target voltage via adjusting the current sharing DCDC converters based on the target voltage and the actually measured cell array voltage.

3. The battery current sharing control method according to claim 2, wherein the determining the target voltage of all the cell array branches comprises:

determining a maximum voltage value in the actually measured cell array voltages corresponding to all the cell arrays as the target voltage of all the cell array branches; or determining a minimum voltage value in the actually measured cell array voltages corresponding to all the cell arrays as the target voltage of all the cell array branches; or determining an average voltage value of the actually measured cell array voltages corresponding to all the cell arrays as the target voltage of all the cell array branches; or determining a voltage of a bus connected to the plurality of cell array branches as the target voltage of all the cell array branches.

4. The battery current sharing control method according to claim 2, wherein the adjusting the duty cycle of each of the current sharing DCDC converters based on the voltage correction value corresponding to the current sharing DCDC converter comprises:

obtaining a voltage sharing voltage correction value corresponding to the current sharing DCDC converter connected to each of the cell arrays in series by using a formula, wherein the voltage correction value comprises the voltage sharing voltage correction value, the formula is $U_{obj}i=U_{dcStd}-U_{bat}i$, $U_{obj}i$ is a voltage sharing voltage correction value of an $i^{th}$ cell array, $U_{dcStd}$ is the target voltage, and $U_{bat}i$ is an actually measured cell array voltage of the $i^{th}$ cell array; and adjusting the duty cycle of each of the current sharing DCDC converters based on the voltage sharing voltage correction value corresponding to the current sharing DCDC converter.

5. The battery current sharing control method according to claim 2, wherein before the acquiring the actually measured cell array current corresponding to each of the cell arrays, the battery current sharing control method further comprises:

acquiring actually measured branch voltages corresponding to all cell arrays; and controlling, in a case that the actually measured branch voltages corresponding to all the cell arrays are within an allowable error range of the target voltage, all the cell array branches to be connected to a bus in parallel.

6. The battery current sharing control method according to claim 5, wherein after the controlling all the cell array branches to be connected to the bus in parallel, the battery current sharing control method further comprises:

acquiring current cell array capacities corresponding to all the cell array branches, and determining whether the current cell array capacities are between a lower-limit cell array capacity and an upper-limit cell array capacity; and disconnecting, in response to determining that a current cell array capacity corresponding to a first one of the cell array branches is not between the lower-limit cell array capacity and the upper-limit cell array capacity, the first one of the cell array branches from the bus, and repeatedly performing the step of acquiring the actually measured cell array voltage corresponding to each of the cell arrays.

7. The battery current sharing control method according to claim 1, wherein the determining the target current of all the cell arrays based on the actually measured cell array currents corresponding to all the cell arrays comprises:

determining an average current of the actually measured cell array currents corresponding to all the cell arrays as the target current of all the cell arrays; or calculating a charge/discharge rate coefficient based on current cell array capacities corresponding to all the cell arrays and a current charge/discharge limit value; and determining the target current of all the cell arrays based on the actually measured cell array currents corresponding to all the cell arrays and the charge/discharge rate coefficient.

8. The battery current sharing control method according to claim 1, wherein the adjusting the duty cycle of each of the current sharing DCDC converters based on the voltage correction value corresponding to the current sharing DCDC converter comprises:

obtaining a current sharing voltage correction value corresponding to the current sharing DCDC converter connected to each of the cell arrays in series by using a formula, wherein the voltage correction value comprises the current sharing voltage correction value, the formula is $DaltaU_{obj}i=(I_{bat}i-I_{obj}i)*(K_p+K_i/s)$, $DaltaU_{obj}i$ is a current sharing voltage correction value of an $i^{th}$ cell array, $I_{bat}i$ is an actually measured cell array current of the $i^{th}$ cell array, $I_{obj}i$ is a target current of the $i^{th}$ cell array, $K_p$ is a preset rate coefficient, $K_i$ is a preset integral coefficient of the $i^{th}$ cell array, and s is a frequency domain; and adjusting the duty cycle of each of the current sharing DCDC converters based on the current sharing voltage correction value corresponding to the current sharing DCDC converter.

9. The battery current sharing control system according to claim 1, wherein each of the current sharing DCDC converters is a non-isolated DCDC converter connected to a current sharing power supply, an input terminal of the non-isolated DCDC converter is connected to the current sharing power supply, and an output terminal of the current sharing DCDC converter is connected to a corresponding cell array.

10. The battery current sharing control system according to claim 9, wherein the current sharing DCDC converter is an isolated DCDC converter.

11. A battery current sharing control system, comprising:

a monitoring module and a plurality of cell array branches arranged on a bus in parallel, wherein each of the cell array branches comprises a cell array and a current sharing DCDC converter connected to the cell array, and the monitoring module is connected to the cell arrays and the current sharing DCDC converters and is configured to acquire cell array state information of the cell array branches, and adjust a duty cycle of each of the current sharing DCDC converters based on the cell array state information, to achieve current sharing control, wherein the cell array state information comprises a voltage correction value corresponding to the current sharing DCDC converter.

12. The battery current sharing control system according to claim 11, wherein the battery current sharing control system further comprises a current sharing power supply; the current sharing DCDC converter is a non-isolated DCDC converter connected to the current sharing power supply; an input terminal of the non-isolated DCDC converter is connected to the current sharing power supply; and an output terminal of the current sharing DCDC converter is connected to the cell array and the bus.

13. The battery current sharing control system according to claim 11, wherein the battery current sharing control system further comprises a current sharing power supply; the current sharing DCDC converter is a non-isolated DCDC converter connected to the current sharing power supply; a first input terminal of the current sharing DCDC converter is connected to the current sharing power supply, and a second input terminal is connected to the current sharing power supply; a first output terminal of each of the current sharing DCDC converters is connected to the cell array, and a second output terminal is connected to the bus; or the first output terminal of each of the current sharing DCDC converters is connected to the bus, and the second output terminal is connected to the cell array.

14. The battery current sharing control system according to claim 13, wherein the non-isolated DCDC converter comprises a first resonant inductance L11, a first drive power tube Q11, a second drive power tube Q12, a first reverse diode D11, a second reverse diode D12, a first energy storage capacitor C11, and a second energy storage capacitor C12; the first resonant inductance L11 and the first drive power tube Q11 are arranged in series between the first input terminal and the first output terminal; one end of the first energy storage capacitor C11 is connected to the first resonant inductance L11 and the first drive power tube Q11, and the other end of the first energy storage capacitor C11 is connected to the second input terminal and the second output terminal; one end of the second drive power tube Q12 is connected to the first drive power tube Q11 and the first output terminal, and the other end of the second drive power tube Q12 is connected to the second input terminal and the second output terminal; one end of the second energy storage capacitor C12 is connected to the first drive power tube Q11 and the first output terminal, and the other end of the second energy storage capacitor C12 is connected to the second input terminal and the second output terminal; the first reverse diode D11 and the first drive power tube Q11 are reversely connected in parallel; and the second reverse diode D12 and the second drive power tube Q12 are reversely connected in parallel.

15. The battery current sharing control system according to claim 11, wherein the current sharing DCDC converter is an isolated DCDC converter; an input terminal of the isolated DCDC converter is connected to the cell array; and an output terminal of the isolated DCDC converter is connected to the cell array and the bus.

16. The battery current sharing control system according to claim 11, wherein the current sharing DCDC converter is an isolated DCDC converter; and a first input terminal and a second input terminal of the isolated DCDC converter are connected to the cell array, and a first output terminal and a second output terminal of the isolated DCDC converter are respectively connected to the cell array and the bus.

17. The battery current sharing control system according to claim 16, wherein the isolated DCDC converter includes a high frequency transformer T21, a second resonant inductance L21, a first bridge rectifier circuit, a second bridge rectifier circuit, and a filter capacitor C21; the first bridge rectifier circuit is arranged on a primary side of the high frequency transformer T21 and is connected to the first input terminal and the second input terminal; the second bridge rectifier circuit is arranged on a secondary side of the high frequency transformer T21 and is connected to the first output terminal and the second output terminal; the second resonant inductance L21 is arranged between the primary side of the high frequency transformer T21 and the first bridge rectifier circuit; and the filter capacitor C21 is arranged between the first output terminal and the second output terminal, and is connected to the second bridge rectifier circuit in parallel.

18. The battery current sharing control system according to claim 17, wherein the first bridge rectifier circuit includes a first drive switch transistor Q21 and a second drive switch transistor Q22 connected to the first input terminal, and a third drive switch transistor Q23 and a fourth drive switch transistor Q24 connected to the second input terminal; the first drive switch transistor Q21 is connected to the third drive switch transistor Q23, and the monitoring module 10 is connected to the first drive switch transistor Q21 and the third drive switch transistor Q23, to control the first drive switch transistor Q21 to be conducted to the third drive switch transistor Q23 in a complementary manner; the second drive switch transistor Q22 is connected to the fourth drive switch transistor Q24, and the monitoring module 10 is connected to the second drive switch transistor Q22 and the fourth drive switch transistor Q24, to control the second drive switch transistor Q22 to be conducted to the fourth drive switch transistor Q24 in a complementary manner; and one end of the primary side of the high frequency transformer T21 is connected to the first drive switch transistor Q21 and the third drive switch transistor Q23 through the second resonant inductance L21, and the other end of the primary side of the high frequency transformer T21 is connected to the second drive switch transistor Q22 and the fourth drive switch transistor Q24.

19. The battery current sharing control system according to claim 17, wherein the second bridge rectifier circuit includes a fifth drive switch transistor Q25 and a sixth drive switch transistor Q26 connected to the first output terminal, and a seventh drive switch transistor Q27 and an eighth drive switch transistor Q28 connected to the second output terminal; the fifth drive switch transistor Q25 is connected to the seventh drive switch transistor Q27, and the monitoring module 10 is connected to the fifth drive switch transistor Q25 and the seventh drive switch transistor Q27, to control the fifth drive switch transistor Q25 to be conducted to the seventh drive switch transistor Q27 in a complementary manner; the sixth drive switch transistor Q26 is connected to the eighth drive switch transistor Q28, and the monitoring module 10 is connected to the sixth drive switch transistor Q26 and the eighth drive switch transistor Q28, to control the sixth drive switch transistor Q26 to be conducted to the eighth drive switch transistor Q28 in a complementary manner; and one end of the secondary side of the high frequency transformer T21 is connected to the fifth drive switch transistor Q25 and the seventh drive switch transistor Q27, and the other end of the secondary side of the high frequency transformer T21 is connected to the sixth drive switch transistor Q26 and the eighth drive switch transistor Q28.

20. The battery current sharing control system according to claim 11, wherein the cell array state information comprises at least one of: an actually measured cell array voltage, an actually measured cell array current, a current cell array capacity, an actually measured converter voltage, an actually measured converter current, or a bus voltage.

* * * * *